US010424089B2

(12) United States Patent
Bauer et al.

(10) Patent No.: US 10,424,089 B2
(45) Date of Patent: Sep. 24, 2019

(54) MAGNETIC RESONANCE TOMOGRAPHY PREVIEW

(71) Applicants: Simon Bauer, Baunach (DE); Wilhelm Horger, Schwaig (DE); Ralf Kartäusch, Erlangen (DE)

(72) Inventors: Simon Bauer, Baunach (DE); Wilhelm Horger, Schwaig (DE); Ralf Kartäusch, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 265 days.

(21) Appl. No.: 15/437,875

(22) Filed: Feb. 21, 2017

(65) Prior Publication Data

US 2017/0243377 A1 Aug. 24, 2017

(30) Foreign Application Priority Data

Feb. 22, 2016 (DE) .................. 10 2016 202 663

(51) Int. Cl.
*G06T 11/00* (2006.01)
*G01R 33/56* (2006.01)
*G01R 33/561* (2006.01)
*G01R 33/54* (2006.01)

(52) U.S. Cl.
CPC .......... *G06T 11/003* (2013.01); *G01R 33/543* (2013.01); *G01R 33/561* (2013.01); *G01R 33/5608* (2013.01); *G06T 2210/41* (2013.01)

(58) Field of Classification Search
CPC ............. G01R 33/561; G01R 33/5608; G01R 33/543; G06T 11/003
See application file for complete search history.

(56) References Cited

U.S. PATENT DOCUMENTS

| 5,881,728 | A | 3/1999 | Mistretta et al. |
| 9,436,799 | B2* | 9/2016 | McCoy ............... G06F 19/321 |
| 9,582,152 | B2* | 2/2017 | Gulaka ............... G16H 40/63 |
| 10,019,798 | B2* | 7/2018 | Ninomiya ............... A61B 6/03 |
| 2014/0029818 | A1* | 1/2014 | McCoy ............... G06F 19/321 382/131 |
| 2015/0199121 | A1* | 7/2015 | Gulaka ............... G16H 40/63 715/771 |
| 2016/0004396 | A1* | 1/2016 | Gulaka ............... G16H 40/63 715/771 |
| 2016/0210714 | A1* | 7/2016 | Pan ............... G06F 19/321 |
| 2016/0266222 | A1* | 9/2016 | Nittka ............... G01R 33/543 |

FOREIGN PATENT DOCUMENTS

WO WO2015164761 A1 10/2015

OTHER PUBLICATIONS

German Office Action for related German Application No. 10 2016 202 663.1 dated Nov. 14, 2016, with English Translation.

\* cited by examiner

*Primary Examiner* — Dixomara Vargas
(74) *Attorney, Agent, or Firm* — Lempia Summerfield Katz LLC

(57) ABSTRACT

The disclosure relates to a method for reconstructing a preview of a magnetic resonance examination, a magnetic resonance apparatus, and a computer program product. The method includes recording a first set of magnetic resonance data, from which a second set of magnetic resonance data is selected. Based on the second set of magnetic resonance data, a preview is reconstructed.

20 Claims, 2 Drawing Sheets

10 Magnetic resonance apparatus
11 Magnet unit
12 Main magnet
13 Main magnetic field
14 Patient accommodating region
15 Patient
16 Patient support apparatus
17 Patient table
18 Gradient coil unit
19 Gradient control unit
20 HF antenna unit
21 HF antenna control unit
22 System control unit
23 User interface
24 Display unit
25 Input unit
26 Reconstruction unit
27 Selection unit

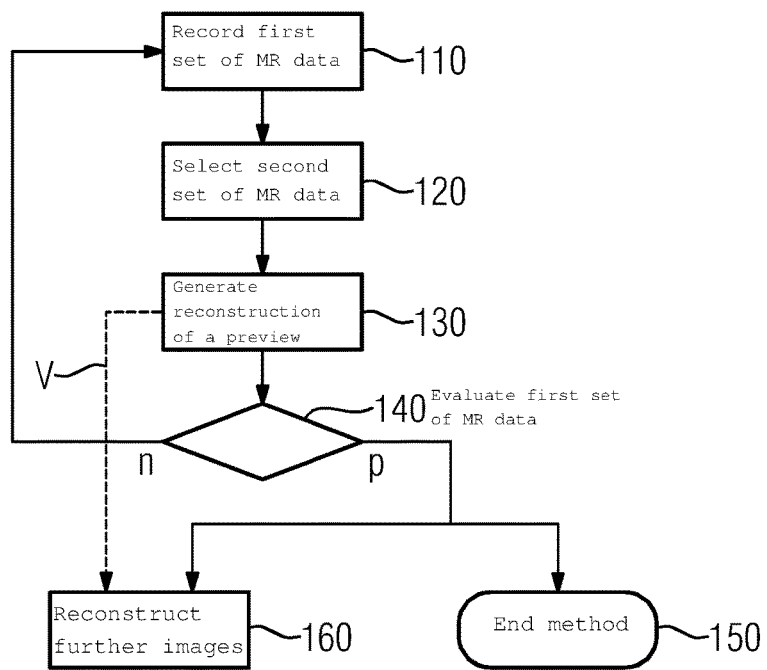
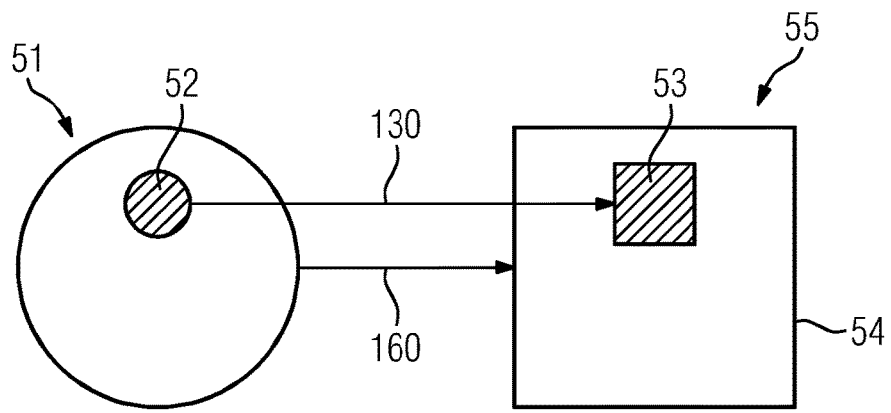

MAGNETIC RESONANCE TOMOGRAPHY PREVIEW

CROSS-REFERENCE TO RELATED APPLICATIONS

The present patent document claims the benefit of DE 102016202663.1, filed on Feb. 22, 2016, that is hereby incorporated by reference in its entirety.

TECHNICAL FIELD

One or more of the present embodiments relate to a method for reconstruction of a preview of a magnetic resonance examination, a magnetic resonance apparatus and a computer program product.

BACKGROUND

Magnetic resonance tomography (MRT), or magnetic resonance imaging (MRI), is an imaging examination method used primarily in medical diagnostics for representing the structure and function of tissues and/or organs in an examination object (e.g., a body of a human or animal patient).

In a magnetic resonance apparatus, rapidly switched gradient fields may be overlaid onto a static basic magnetic field. High frequency (HF) pulses from a high frequency antenna unit of the magnetic resonance apparatus are radiated into the examination object, causing a magnetization of at least a part of the examination object. As a result of the magnetization, magnetic resonance signals are triggered and may be acquired (e.g., with the aid of local coils and/or a whole body coil), and are converted into magnetic resonance data. Based on the magnetic resonance data recorded, magnetic resonance images may be reconstructed.

Reconstruction of the magnetic resonance images of a magnetic resonance examination may be very time-consuming. For example, it may be very time-consuming if iterative reconstruction techniques are used. Iterative reconstruction techniques are often used together with compressed-sensing (CS) techniques to achieve a greater temporal resolution of the magnetic resonance images. Because an iterative (e.g., act-wise) reconstruction often requires a large computational effort (e.g., even with powerful modern hardware), long reconstruction times may be a consequence. Depending on the use case, computational times be longer than ten minutes per magnetic resonance examination. However, an operator (e.g., a medical radiology technician or a doctor) decides whether a scan (e.g., a scan slice) is complete and the patient can be released, or whether a further magnetic resonance examination is to be carried out.

SUMMARY AND DESCRIPTION

The scope of the present disclosure is defined solely by the appended claims and is not affected to any degree by the statements within this summary.

One or more of the present embodiments may obviate one or more of the drawbacks or limitations in the related art. For example, a method for reconstructing a preview enabling the operator to make a decision rapidly concerning a further procedure is provided.

A method for reconstructing a preview of a magnetic resonance examination includes recording a first set of magnetic resonance, from which a second set of magnetic resonance data is selected. Based on the second set of magnetic resonance data, a preview is reconstructed.

Selecting the second set of magnetic resonance data may take place manually (e.g., by an operator of the magnetic resonance apparatus) and/or automatically. For an automatic selection, selection criteria may be stored (e.g., electronically in a memory store).

The second set of magnetic resonance data may be a true subset of the first set of magnetic resonance data (e.g., the first set of magnetic resonance data includes more data than the second set of magnetic resonance data). The first set of magnetic resonance data may include all data of the magnetic resonance examination. A magnetic resonance examination may include the scanning of a scan slice.

On operation of the magnetic resonance apparatus, a plurality of magnetic resonance examinations on a patient may also be carried out directly one after another (e.g., a plurality of scan slices is scanned sequentially). Advantageously, the method is carried out anew for each magnetic resonance examination.

The preview may include one or a plurality of magnetic resonance images. The magnetic resonance images may be displayed to the operator by an output unit (e.g., a monitor).

No additional alternative reconstruction is used (e.g., based on magnetic resonance data specifically recorded therefore) to generate a preview for a magnetic resonance examination. For example, computation time that would be necessary due to additional alternative reconstruction and that would delay the reconstruction of the first set of magnetic resonance data is spared. The preview may thus be generated without significant additional computational effort and the operator may rapidly decide on the further procedure based on the preview.

A compressed sensing technique and/or an iterative reconstruction technique may be used for reconstructing the preview. A rapid reconstruction of a preview may be helpful because a reconstruction of the whole first set of magnetic resonance data may involve a long period of time.

A compressed sensing technique (e.g., a compressive sensing technique or compressive sampling technique) is a data processing technique in which data is acquired and reconstructed efficiently in that solutions are found to an underdetermined system of linear equations. Solutions to the system of linear equations may be found using iterative reconstruction techniques.

Based on the preview, an evaluation of the first set of magnetic resonance data may take place. For example, the operator may assess whether the recording of the first set of magnetic resonance data was successful. The operator may estimate (e.g., based on the preview) whether any further images reconstructable from the first set of magnetic resonance data is free from artifacts (e.g., caused by a movement of the patient).

In the event of a negative evaluation of the first set of magnetic resonance data based on the preview, another set of magnetic resonance data may be recorded (e.g., a new first set of magnetic resonance data). A negative evaluation may exist if, based on the preview, it is concluded that the quality of the first set of magnetic resonance data is faulty.

The scanning procedure may be repeated so that a new first set magnetic resonance data is available. The new scan may be carried out with adjusted recording parameters. The new set of magnetic resonance data may be processed in the same manner as the original first set of magnetic resonance data (e.g., a new second set of magnetic resonance data may be selected for reconstructing a new preview, etc.). This process may be repeated until satisfactory first set of magnetic resonance data is available.

The method may provide that, in the event of a positive evaluation of the first set of magnetic resonance data based on the preview, recording of additional magnetic resonance data is omitted. By dispensing with the recording of additional magnetic resonance data, the magnetic resonance apparatus may be operated efficiently. Thus, one or more of the present embodiments is delineated from other methods that initially perform a pre-scan serving primarily or exclusively for acquiring preview data to monitor recording parameters and/or an image region, and only thereafter, given a positive evaluation, an actual scan is carried out.

Thus, a recording of additional magnetic resonance data of the same body region of the patient with the same recording parameters may be omitted. Naturally, this does not preclude that following a positive evaluation, other examinations of the patient may be undertaken (e.g., another body region of the patient and/or the same body region is investigated with different recording parameters). Other first sets of magnetic resonance data may again be recorded (e.g., the method may be started anew).

One embodiment of the method provides that, given a positive evaluation of the first set of magnetic resonance data based on the preview, further images are reconstructed based on at least a part of the first set of magnetic resonance data and/or at least a part of the first set of magnetic resonance data is provided for a reconstruction of further images.

Provided the preview makes it apparent that the recording of the first set of magnetic resonance data was successful, based on at least one part of the first set of magnetic resonance data, further images may be generated (e.g., for a diagnosis). The further images may not be identical to the preview. The reconstruction of the further images may carried out only partially or not at all (e.g., the first set of magnetic resonance data is provided for a possible later reconstruction). A reconstruction of the further images may also be subsequently performed (e.g., a plurality of minutes, a plurality of hours, or a plurality of days after the reconstruction of the preview).

It is provided by the positive evaluation that the first set of magnetic resonance data recorded is suitable for a generation of further images (e.g., of sufficient quality) and that no new first set of magnetic resonance data has to be recorded. It is thus provided that the patient under examination may be released as soon as possible and/or that the magnetic resonance apparatus is available for other scans.

The magnetic resonance data, based on which the further images are reconstructed and/or which is provided for a reconstruction of further images, may not include the second set of magnetic resonance data. The further images may not be reconstructed based on the overall first set of magnetic resonance data, but only based on the first set of magnetic resonance data less the second set of magnetic resonance data. Consequently, unnecessary double reconstruction of the second set of magnetic resonance data may be avoided.

It is provided that directly following the reconstruction of the preview, based on the second set of magnetic resonance data, a reconstruction of the at least one part of the first set of magnetic resonance data may be started.

Performance of an evaluation of the first set of magnetic resonance data based on the preview is not awaited (e.g., the time is used to start with the reconstruction of the at least one part of the first set of magnetic resonance data in the background). If an evaluation is negative, then the results of the first set of magnetic resonance data reconstructed up until then may be rejected.

One or more of the present embodiments of the method provides that in the reconstruction of the further images, a compressed sensing technique and/or an iterative reconstruction technique is used and/or is usable. Using the preview, a great efficiency gain may be achieved because compressed sensing techniques and/or iterative reconstruction techniques may be computation intensive.

The preview may have a substantially similar quality (e.g., a similar spatial and/or temporal resolution, and/or a similar contrast) as the further images. Thus, reductions in quality are not required in order to accelerate the reconstruction of the preview. The preview may be generated with the same algorithms and/or parameters as the other images.

The preview and the further images may be grouped together into consolidated images. A common data set may be produced, including the information of the preview and the further images. The consolidated figures may include a reconstruction of the entire first set of magnetic resonance data. The consolidated figures may be used for diagnosis.

With substantially identical quality of the preview and the further images, the preview may easily be displayed together with the other images. The reconstruction of the preview is therefore useful for the further process, e.g., in contrast to conventional methods in which the preview may have no further use following an evaluation and/or preliminary view, such as for diagnostic purposes.

One or more of the present embodiments of the method provides that the selection of the second set of magnetic resonance data is carried out by spatial delimitation. A first scan volume may be acquired by the first set of magnetic resonance data. From the first scan volume, a second scan volume is selected. The second scan volume is smaller than the first scan volume. The second scan volume may include particularly relevant parts of the first scan volume (e.g., suitable for generating an informative preview). The delimitation may be defined with the aid of selection parameters.

The spatial delimitation may include a slice selection. For example, for time-resolved three-dimensional scans, the reconstruction may be decoupled in a third spatial dimension. Individual slices may be reconstructed from the middle of the scanned volume along a time domain and then displayed as a preview with substantially the same image quality as the complete (e.g., iterative results).

Selection of the second set of magnetic resonance data may be carried out using temporal delimitation. In a scan including a first time frame within which the first set of magnetic resonance data was recorded, a second time frame (e.g., a time point) may be selected that is shorter than the first time frame (e.g., in which the second set of magnetic resonance data was recorded). The delimitation may be defined with the aid of selection parameters.

Furthermore, a magnetic resonance apparatus is provided suitable for carrying out a method of reconstructing a preview of a magnetic resonance examination. The magnetic resonance apparatus is configured to record a first set of magnetic resonance data and includes a selection unit configured to select a second set of magnetic resonance data from the first set of magnetic resonance data and a reconstruction unit configured to reconstruct a preview based on the second set of magnetic resonance data.

A computer program product is provided that includes a program and is directly loadable into a memory store of a programmable computer unit of a magnetic resonance apparatus. The computer program product includes a program (e.g., libraries and auxiliary functions to carry out a method for reconstructing a preview based on magnetic resonance data when the computer program product is executed in the magnetic resonance apparatus). The computer program product may include an item of software with a source code that is compiled and linked, or that is only interpreted, or an executable software code that, for execution, is only loaded. Using the computer program product, the method for reconstructing a preview of a magnetic resonance examination may be carried out rapidly, exactly reproducibly and robustly. The computer program product is configured such that it may carry out the method acts using the magnetic resonance apparatus. The magnetic resonance apparatus has the respective pre-conditions (e.g., a suitable working memory store, a suitable graphics card or a suitable logic unit so that the respective method acts may be carried out efficiently).

The computer program product may be stored on a computer-readable medium or is deposited on a network or server from where the computer program product may be loaded into the processor. Control information of the computer program product may be stored on an electronically readable data storage medium. The items of control information of the electronically readable data storage medium may be configured such that the items carry out a method when the data storage medium is used. Examples of electronically readable data storage media are a DVD, a magnetic tape or a USB stick, on which electronically readable control information (e.g., software) is stored. When this control information is read from the data storage medium, all the embodiments of the above-described method may be carried out. One or more of the present embodiments may also start from the aforementioned computer-readable medium and/or the aforementioned electronically readable data storage medium.

BRIEF DESCRIPTION OF THE DRAWINGS

Further advantages, features and details of the disclosure are disclosed in the exemplary embodiments described below and the drawings. Parts which correspond to one another are provided with the same reference signs in all the drawings.

FIG. 2 is a block diagram of a method according to one or more of the present embodiments.

FIG. 3 illustrates the principle of magnetic resonance data and images reconstructable from the magnetic resonance data.

DETAILED DESCRIPTION

Figure 1:
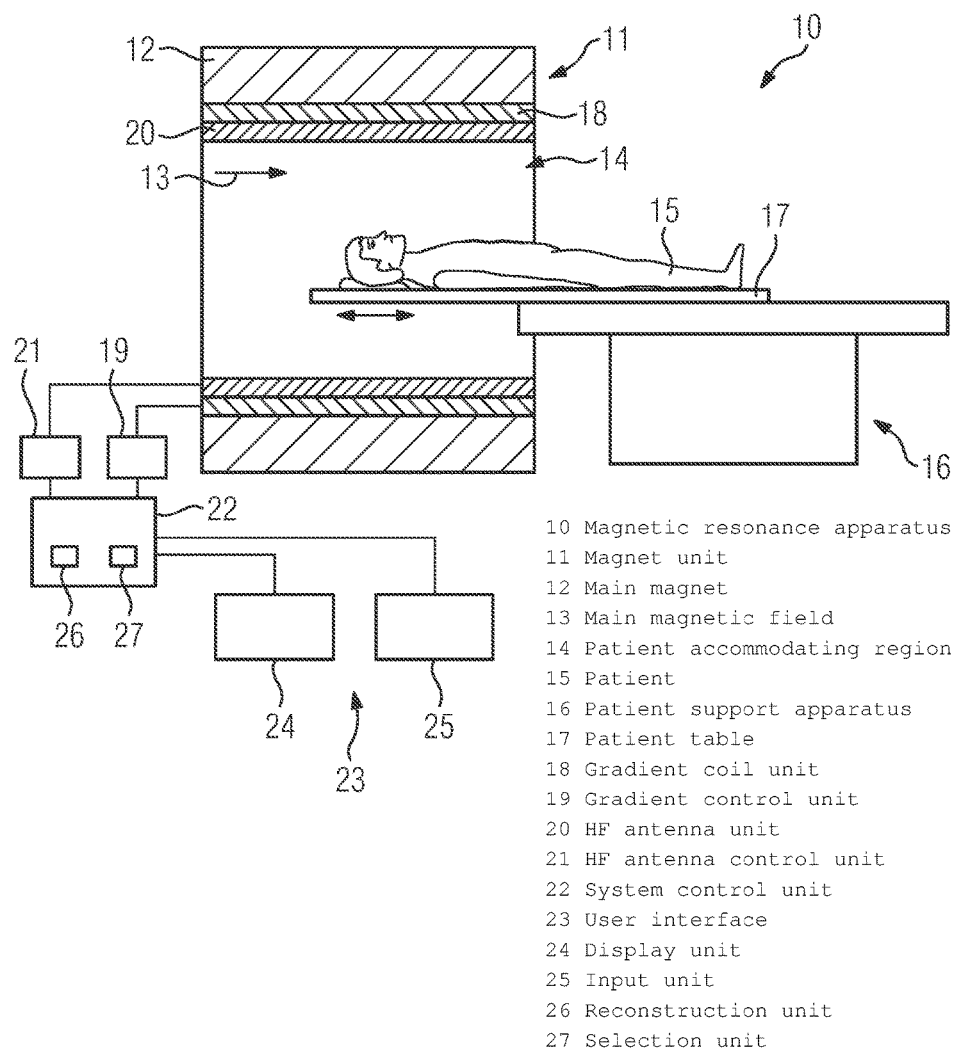
FIG. 1 is a schematic representation of a magnetic resonance apparatus according to one or more of the present embodiments.

FIG. 1 shows schematically a magnetic resonance apparatus 10. The magnetic resonance apparatus 10 has a magnet unit 11 that includes a superconducting main magnet 12 for generating a strong (e.g., temporally constant) main magnetic field 13. The magnetic resonance apparatus 10 has a patient accommodating region 14 to accommodate a patient 15. In the present exemplary embodiment, the patient accommodating region 14 is configured cylindrically and is surrounded cylindrically in a peripheral direction by the magnet unit 11. Other configurations of the patient accommodating region 14 may be provided. The patient 15 may be pushed into the patient accommodating region 14 by a patient support apparatus 16 of the magnetic resonance apparatus 10. For this purpose, the patient support apparatus 16 has a patient table 17 configured to be movable within the patient accommodating region 14.

The magnet unit 11 also has a gradient coil unit 18 for generating magnetic field gradients used for position encoding during an imaging process. The gradient coil unit 18 is controlled by a gradient control unit 19 of the magnetic resonance apparatus 10. The magnet unit 11 also includes a high frequency antenna unit 20 configured in the present exemplary embodiment as a body coil that is firmly integrated into the magnetic resonance apparatus 10. The high frequency antenna unit 20 is configured for an excitation of atomic nuclei arising in the main magnetic field 13 generated by the main magnet 12. The high frequency antenna unit 20 is controlled by a high frequency antenna control unit 21 of the magnetic resonance apparatus 10 and radiates high frequency magnetic resonance sequences into an examination space. The examination space is substantially formed by a patient accommodating region 14 of the magnetic resonance apparatus 10. The high frequency antenna unit 20 is also configured for the receiving of magnetic resonance signals that are converted into magnetic resonance data.

For controlling the main magnet 12, the gradient control unit 19 and the high frequency antenna control unit 21, the magnetic resonance apparatus 10 includes a system control unit 22. The system control unit 22 centrally controls the magnetic resonance apparatus 10 (e.g., the execution of a pre-determined imaging gradient echo sequence). The system control unit 22 also includes a reconstruction unit 26 for reconstructing magnetic resonance data recorded during the magnetic resonance examination. The system control unit 22 also includes a programmable computer unit (not shown) with a memory or storage into which a program is loadable to carry out a method for reconstruction of a preview based on magnetic resonance data.

The magnetic resonance apparatus 10 includes a user interface 23 connected to the system control unit 22. Control information (e.g., imaging parameters and reconstructed images, such as a preview) may be displayed on a display unit 24 (e.g., on at least one monitor) of the user interface 23 for medical operating personnel. In addition, the user interface 23 has an input unit 25 for inputting information and/or parameters by the medical operating personnel during a scanning procedure. For example, with the aid of the input unit 25, selection parameters for selecting magnetic resonance data may be input and transferred to a selection unit 27 of the system control unit 22.

FIG. 2 shows a block diagram illustrating an exemplary method In act 110, a first set of magnetic resonance data is recorded by the magnetic resonance apparatus 10.

In act 120, using the selection unit 27, a second set of magnetic resonance data is selected from the first set of magnetic resonance data. The selection may be supported by the input unit 25 of the magnetic resonance apparatus 10 through the input of selection parameters. The selection of the second set of magnetic resonance data may take place by spatial delimitation (e.g., slice selection) and/or by temporal delimitation.

In act 130, a reconstruction of a preview is generated based on the second set of magnetic resonance data. In reconstructing the preview a compressed sensing technique and/or an iterative reconstruction technique may be used.

The further acts 140, 150, 160 are optional. In act 140, based on the preview, an evaluation of the first set of magnetic resonance data is performed. In the event of a negative evaluation (n), a new first set of magnetic resonance data (e.g., a third set of magnetic resonance data) is recorded (e.g., act 110 is repeated). In the event of a positive evaluation (p) of the first set of magnetic resonance data, a recording of additional magnetic resonance data is omitted. In the event of a positive evaluation (p) in act 160, further images are reconstructed based on at least a part of the first set of magnetic resonance data and/or the method is ended in act 150, wherein at least a part of the first set of magnetic resonance data is provided for a reconstruction of further images in a later act (not shown here).

In order to start with the reconstruction of the further images in act 160, it is not necessary to await the evaluation in act 140. Act 160 may be started directly following the reconstruction of the preview based on the second set of magnetic resonance data. This is indicated in FIG. 2 with the reference sign V. In the reconstruction of the further images, in act 160 a compressed sensing technique and/or an iterative reconstruction technique may be used.

In FIG. 3, a first set of magnetic resonance data 51 is shown containing the second set of magnetic resonance data 52 that was selected in act 120. The second set of magnetic resonance data 52 is a true subset of the first set of magnetic resonance data 51. In act 130, based on the second set of magnetic resonance data 52, a preview 53 is reconstructed. In the act 160, based on at least a part of the first set of magnetic resonance data 51 (e.g., may not include the second set of magnetic resonance data 52), further images 54 are reconstructed. The preview 53 and the further images 54 may be grouped together into consolidated images 55. The preview 53 may have a substantially identical quality to the further images 54.

Finally, it is noted that the method described above in detail and the magnetic resonance apparatus disclosed are merely exemplary embodiments that may be modified by a person skilled in the art in a wide variety of ways without departing from the scope of this disclosure. Further, the use of the indefinite article "a" or "an" does not preclude that the relevant features may also be present plurally. Similarly, the expression "unit" does not exclude the relevant components including a plurality of cooperating subcomponents that may also be spatially distributed if required.

The elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present disclosure has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for reconstruction of a preview based on magnetic resonance data, the method comprising:
   recording a first set of magnetic resonance data;
   selecting a second set of magnetic resonance data from the first set of magnetic resonance data, wherein the selecting of the second set of magnetic resonance data comprises spatial delimitation, temporal delimitation, or a combination thereof; and
   reconstructing a preview based on the second set of magnetic resonance data.

2. The method of claim 1, wherein a compressed sensing technique, an iterative reconstruction technique, or the compressed technique and the iterative reconstruction technique are used in the reconstructing of the preview.

3. The method of claim 1, further comprising:
   evaluating, based on the preview, the first set of magnetic resonance data.

4. The method of claim 3, further comprising:
   recording a third set of magnetic resonance data following a negative evaluation of the first set of magnetic resonance data based on the preview.

5. The method of claim 3, further comprising, following a positive evaluation of the first set of magnetic resonance data based on the preview:
   reconstructing images based on a portion of the first set of magnetic resonance data, providing at least a portion of the first set of magnetic resonance data for image reconstruction, or reconstructing the images based on the portion of the first set of magnetic resonance data and providing the at least a portion of the first set of magnetic resonance data for image reconstruction.

6. The method of claim 5, wherein the portion of the first set of magnetic resonance data comprises the second set of magnetic resonance data, the at least a portion of the first set of magnetic resonance data comprises the second set of magnetic resonance data, or both the portion of the first set of magnetic resonance data and the at least a portion of the first set of magnetic resonance data comprises the second set of magnetic resonance data.

7. The method claim 1, wherein, directly following the reconstruction of the preview and based on the second set of magnetic resonance data, reconstruction of at least one portion of the first set of magnetic resonance data is started.

8. The method of claim 5, wherein, in the reconstruction of the images, a compressed sensing technique, an iterative reconstruction technique, or the compressed sensing technique and the iterative reconstruction technique are used.

9. The method of claim 5, wherein the preview has a substantially identical quality to the images.

10. The method of claim 5, wherein the preview and the images are grouped together into consolidated images.

11. The method of claim 1, wherein the selecting of the second set of magnetic resonance data is carried out by the spatial delimitation.

12. The method of claim 11, wherein the spatial delimitation comprises a slice selection.

13. The method of claim 1, wherein the selecting of the second set of magnetic resonance data is carried out by the temporal delimitation.

14. A magnetic resonance apparatus configured to record a first set of magnetic resonance data, the apparatus comprising:
   a selector configured to select a second set of magnetic resonance data from the first set of magnetic resonance data, wherein the selecting of the second set of magnetic resonance data comprises spatial delimitation, temporal delimitation, or a combination thereof, and
   a reconstructor configured to reconstruct a preview based on the second set of magnetic resonance data.

15. The magnetic resonance apparatus of claim 14, wherein the reconstructor uses a compressed sensing technique, an iterative reconstruction technique, or the compressed technique and the iterative reconstruction technique in reconstructing the preview.

16. The magnetic resonance apparatus of claim 15, further comprising:
   an evaluator configured to evaluate, based on the preview, the first set of magnetic resonance data.

17. A computer program product comprising program code stored on a non-transitory computer-readable storage medium, the program code, when executed on a computer, is configured to:
   record a first set of magnetic resonance data;
   select a second set of magnetic resonance data from the first set of magnetic resonance data, wherein the selecting of the second set of magnetic resonance data comprises spatial delimitation, temporal delimitation, or a combination thereof; and
   reconstruct a preview based on the second set of magnetic resonance data.

18. The computer program product of claim 17, wherein a compressed sensing technique, an iterative reconstruction technique, or the compressed technique and the iterative reconstruction technique are used in reconstructing the preview.

19. The computer program product of claim 17, further comprising program code, that when executed on a computer, is configured to:
   evaluate, based on the preview, the first set of magnetic resonance data.

20. The computer program product of claim 19, further comprising program code, that when executed on a computer, is configured to:
   record a third set of magnetic resonance data following a negative evaluation of the first set of magnetic resonance data based on the preview.

* * * * *